United States Patent
Singh

(10) Patent No.: US 8,890,638 B2
(45) Date of Patent: Nov. 18, 2014

(54) STUB-TUNED WIREBOND PACKAGE

(75) Inventor: Prashant Singh, Eden Prairie, MN (US)

(73) Assignee: LSI Corporation, San Jose, CA (US)

(*) Notice: Subject to any disclaimer, the term of this patent is extended or adjusted under 35 U.S.C. 154(b) by 2039 days.

(21) Appl. No.: 11/437,059

(22) Filed: May 18, 2006

(65) Prior Publication Data
US 2007/0268088 A1 Nov. 22, 2007

(51) Int. Cl.
*H03H 7/38* (2006.01)
*H05K 1/02* (2006.01)
*H01L 23/66* (2006.01)
*H01P 5/02* (2006.01)
*H01L 23/00* (2006.01)

(52) U.S. Cl.
CPC ............... *H05K 1/025* (2013.01); *H03H 7/38* (2013.01); *H01L 23/66* (2013.01); *H01L 24/45* (2013.01); *H01L 24/49* (2013.01); *H01L 2223/6611* (2013.01); *H01L 2224/05553* (2013.01); *H01L 2224/45144* (2013.01); *H01L 2224/48* (2013.01); *H01L 2224/49171* (2013.01); *H01L 2924/01005* (2013.01); *H01L 2924/01014* (2013.01); *H01L 2924/01027* (2013.01); *H01L 2924/01079* (2013.01); *H01L 2924/14* (2013.01); *H01L 2924/19041* (2013.01); *H01L 2924/19042* (2013.01); *H01L 2924/19043* (2013.01); *H01L 2924/30105* (2013.01); *H01L 2924/30107* (2013.01); *H01L 2924/3011* (2013.01); *H01P 5/02* (2013.01); *H05K 2201/09236* (2013.01); *H05K 2201/09727* (2013.01); *H05K 2201/09781* (2013.01); *H05K 2203/049* (2013.01); *H01L 24/48* (2013.01); *H01L 2924/01006* (2013.01); *H01L 2924/01033* (2013.01); *H01L 2224/48599* (2013.01)
USPC .......................................................... 333/32

(58) Field of Classification Search
USPC .............. 333/33, 34; 330/286, 302, 305, 306, 330/307
See application file for complete search history.

(56) References Cited

U.S. PATENT DOCUMENTS 5,266,963 A * 11/1993 Carter ........................... 343/850
5,473,281 A * 12/1995 Honjo ........................... 330/286

OTHER PUBLICATIONS

Electrical Engineering Tutorials, Electrical Impedance, Inductive Reactance, Capaciitve Reactance. pp. 1-5, Feb. 2007.*

* cited by examiner

Primary Examiner — Stephen Jones

(57) ABSTRACT

An apparatus, system and method are described for impedance matching between a semiconductor package and a load on a board. In one embodiment of the present invention, a package trace is provided with an array of stubs that is designed to provide capacitance to the trace in order to more effectively match a wirebond. This improved match results in improvements in return loss, especially in higher speed applications such as broadband. Design parameters such as the width and length of each stub, and the spacing between the stubs may be varied depending on the impedance requirements of the trace.

11 Claims, 4 Drawing Sheets

STUB-TUNED WIREBOND PACKAGE

BACKGROUND

A. Technical Field

The present invention relates generally to transmission line technology, and more particularly, to a transmission line that connects wirebond packages of semiconductor devices and boards.

B. Background of the Invention

Chips used in electronic circuits typically need to be connected to a board on which an electrical system is located. The electrical inter-connection from the chip package to a board can be done by wirebonding techniques. This generally involves using thin metal wires such as gold to connect an IC chip on one side and to outer electrodes on the board.

Wirebonded electrical packages oftentimes behave as transmission lines, especially when data is being communicated on the wirebond at high speeds. In particular, bondwires have associated inductive characteristics that may degrade the performance of the transmission lines. The degradation in performance may be caused due to poor impedance matching, which results in poor return loss characteristics of the lines.

FIG. 1 illustrates an exemplary wirebond package that provides a connection(s) between an IC and a board. The package 100 comprises a driver 110 that drives a load 120. The interconnection between the driver stage and the load 120 occurs through a bondwire 135 and a package trace 140. The driver 110 is modeled to have driver impedance represented by a resistor 115, and the driver capacitance represented by capacitor 130. As previously mentioned the bondwire 135 may act as a transmission line and causes the transmission line to have an inductive impedance. This leads inductive impedance may result in an impedance mismatch between the IC and the board.

The bondwire inductance in a wirebond package may be matched by placing a capacitor in shunt with the inductive bondwire. The shunt capacitor acts by resonating out the inductive impedance of the bondwire. Although this technique is effective in impedance matching, the use of a discrete capacitive component also has drawbacks.

The additional discrete capacitor requires space and may adversely affect the package. The cost of the package implementation may increase due to the addition of the discrete capacitor and may also require modifying the manufacturing process of the IC and/or package. Alternatively, if the capacitor used is integrated on the silicon, then space is consumed on the silicon increases. Electromagnetic compatibility may also be affected due to electrostatic discharge (ESD) caused due to the integrated capacitor.

The discrete capacitor may only properly operate and provide resonation within a narrow band of frequencies. If the package is used over a broader spectrum of frequencies, the characteristics of the capacitor may significantly change and improperly function over certain frequencies. As a result, the actual return loss of the circuit or package varies and may not satisfy various requirements, such as a broadband requirement. Accordingly, the actual applications of an IC package may be limited by its impedance characteristics.

What is needed is an apparatus and method that address the above-described concerns.

SUMMARY OF THE INVENTION

The present invention provides an apparatus and method for impedance matching between a semiconductor package and a board. In one embodiment of the present invention, a package trace is provided with an array of capacitive stubs. The array of stubs may vary the dimensions of the stubs to provide capacitance on the trace over a wider range of frequencies. For example, the design parameters (such as the width and length of each stub and the spacing between the stubs) may be varied to suit the specific impedance matching requirements related to the potential data rates for which the IC package are used.

In one embodiment of the present invention, a trace on a board is used to effectively match the impedance of the board to the semiconductor package. The trace has a plurality of stubs that provide impedance qualities on the trace and may be designed to provide an impedance transformation between a bondwire from a semiconductor package and a board. For example, the stubs may be designed according to the bondwire length, the chip capacitance and the data rate.

In another embodiment of the invention, a stub array trace on board is used to support differential signaling. In such an embodiment, two stub tuned impedance matched traces are utilized to connect with two different bondwires. The arrangement of the stubs may be provided so that each stub occupies the inter-stub space of the other trace. This arrangement of differential signaled stub tuned impedance matched package traces is space efficient because the stubs are designed in an interdigitated manner.

The present invention may be implemented a number of different electronic circuits and packages. The invention can be implemented with a variety of transmission line structures including microstrips, striplines, or co-planar waveguides.

Other objects, features and advantages of the invention will be apparent from the drawings, and from the detailed description that follows below.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

An apparatus, system and method are described for impedance matching between a semiconductor package and a load on a board. In one embodiment of the present invention, a package trace is provided with an array of stubs that is designed to provide capacitance to the trace in order to more effectively match to a wirebond. This improved match results in improvements in return loss, especially in higher speed applications such as broadband. Design parameters such as the width and length of each stub, and the spacing between the stubs may be varied depending on the impedance requirements of the trace.

In the following description, for purpose of explanation, specific details are set forth in order to provide an understanding of the invention. It will be apparent, however, to one skilled in the art that the invention may be practiced without these details. One skilled in the art will recognize that embodiments of the present invention, some of which are described below, may be incorporated into a number of different electronic circuits and packages. Further, the invention can be implemented with variety of transmission line structures, microstrip, stripline, or co-planar waveguides. Structures and devices shown below in block diagram are illustrative of exemplary embodiments of the invention and are meant to avoid obscuring the invention. Furthermore, connections between components within the figures are not intended to be limited to direct connections. Rather, signals between these components may be modified, or otherwise changed by intermediary components.

Reference in the specification to "one embodiment" or "an embodiment" means that a particular feature, characteristic, or function described in connection with the embodiment is included in at least one embodiment of the invention. The appearances of the phrase "in one embodiment" in various places in the specification are not necessarily all referring to the same embodiment.

A. Stub Tuned Impedance Matched Package Modeling

Figure 1:
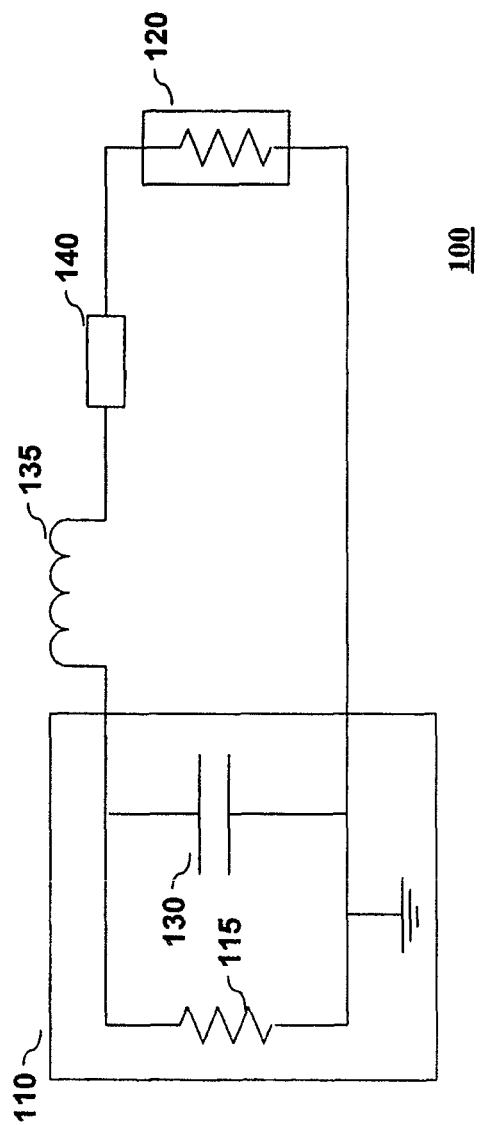
FIG. 1 shows a standard wirebond package model.
Figure 2:
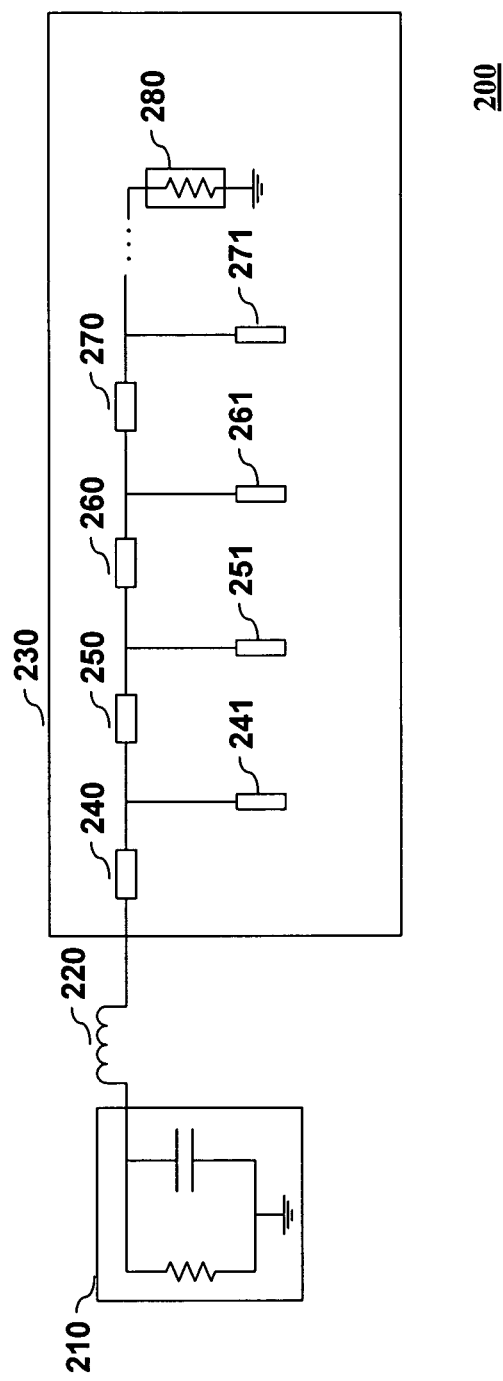
FIG. 2 shows a model of stub tuned impedance matched package according to one embodiment of the invention.

FIG. 2 illustrates an electrical representation of a wirebond package and trace system having improved impedance matching characteristics according to one embodiment of the invention. The system 200 comprises a driver, and associated package, 210 which drives a load 280. The driver package 210 has impedance that includes both a real and imaginary component. A physical connection between the driver 210 and the load 280 is made using a bondwire 220 and a stub tuned impedance matched trace 230. The trace 230 may be designed to provide impedance characteristics through trace components (both those in series and in shunt) resulting in real and imaginary impedance values.

As shown in FIG. 2, the bondwire 220 contributes to the inductance of the package 210, which may be proportional to the length of the bondwire. For example, the length of the bondwire may be 3 mm, which may correspond to an approximate inductance of 3 nH.

Impedance matching between the driver package 210 and the load 280 may be achieved by series of trace component pairs 240-241, 250-251, 260-261, 270-271 that act as an array of stub filters. The modeled components in series 240, 250, 260, 270, that are coupled to the bondwire may be inductors. These modeled components represent the inductance caused by the trace and the stubs. The capacitive components 241, 251, 261, 271 may be placed in shunt. The arrays of components have an effect of providing an impedance transformation between the load 280 and the driver package 210, and of compensating for inductive effects caused by the bondwire. The values of each of the components are dependent on the stub design and may vary with the design implementation.

One skilled in the art will recognize that the stub tuned impedance matched trace acts as an impedance transformer. The bondwire 220 inductance is gradually matched over the length of the trace by the stub array.

B. Stub Tuned Trace

Figure 3:
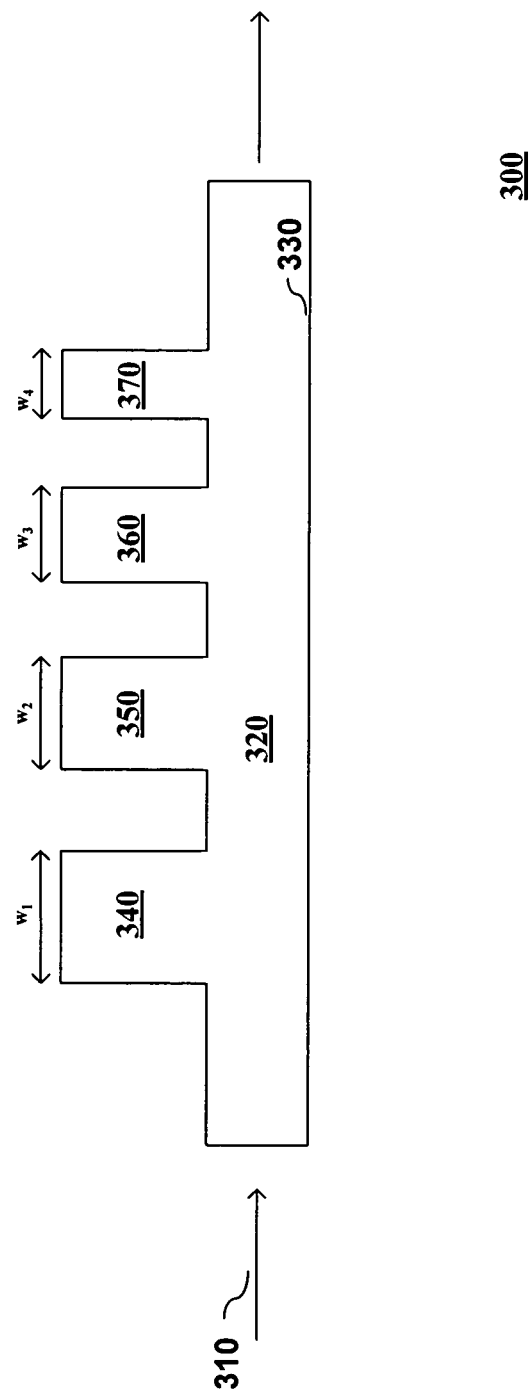
FIG. 3 shows a physical realization of an exemplary stub tuned impedance matched trace as per an embodiment of the present invention.

FIG. 3 illustrates a trace having an array of stubs that are tuned to provide impedance matching characteristics according to one embodiment of the invention. In this particular implementation, an array of four stubs with varying widths is designed in a trace 320. One end of the trace may connect to a bondwire and, receive a signal 310 from a driver.

The dimensions of the stubs and the interspacing between various stubs may be designed to meet the impedance matching requirements of the system. The design parameters may depend on the wirebond length, the impedance value of the driver and load, and the impedance characteristics of the trace material. In one exemplary implementation a first stub 340 may have a width of length $w_1$. A second stub 350 may have a width of length $w_2$ that is smaller than $w_1$. Subsequent stubs 360, 370 may be provided to have further diminishing widths of $w_3$ and $w_4$ respectively. The impedance transformation of the trace progresses along the stubs on the trace and provides improvements in frequency response over a relatively wider band of frequencies.

The trace may also be designed to reduce reflection and power leakage caused by the stub array. Other negative characteristics of the stub array may be accounted for within the design in order to optimize the overall performance of the impedance matching trace.

C. Differential Signaling

Figure 4:
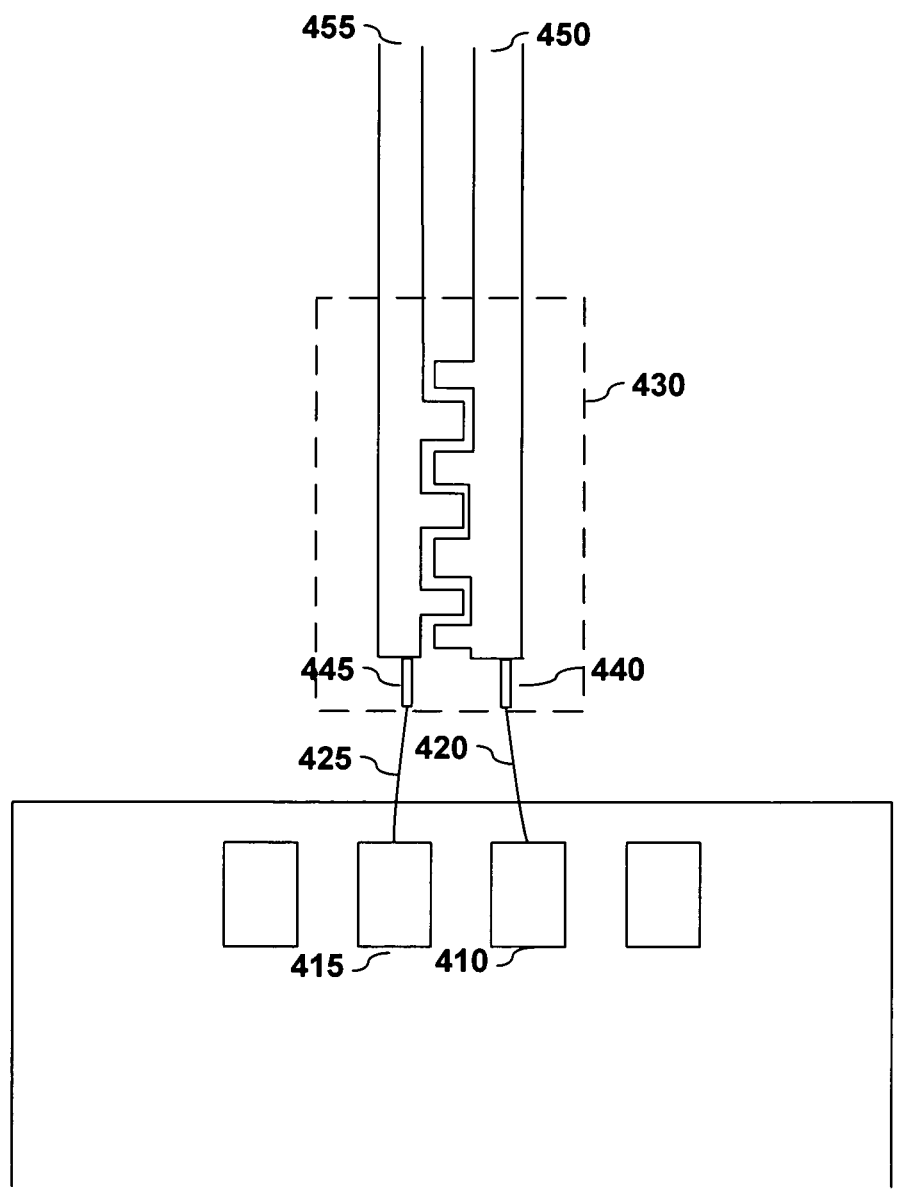
FIG. 4 shows a stub tuned impedance matched trace in a differential signaling implementation as per one embodiment of the present invention.

FIG. 4 illustrates an exemplary differential signaling system in which the stub tuned trace is provided according to one embodiment of the invention. In particular, differential signaling may utilize two stub tuned impedance matched traces 450, 455 to communicate a differential signal from a driver package to a load.

A first bondwire 420 connects a first pad 410 on the driver package to one end of a line 440 which connects to a first stub tuned impedance matched trace 450. A second bondwire 425 may be used to connect a second pad 415 on the driver package to a line 445 which connects to a second stub tuned impedance matched trace 455. The first stub tuned impedance matched trace 450 and the second stub tuned impedance matched trace 455 collectively form stub tuned impedance traces 430 for differential signaling applications.

The first stub tuned impedance matched trace 450 comprises of array of stubs that may vary in sizes. The first stub tuned impedance matched trace 450 may be placed so that the stubs of trace occupy the inter-stub space of the second stub tuned impedance matched trace 455. This particular interspatial design reduces the size required to implement the differential signaling stub tuned impedance traces 430.

Impedance matching using stub designs and modifications within a trace structure allows for impedance functionality to be pulled out of an IC package. The applicability of the stub tuned impedance trace structures allows for implementation across a large number of platforms. In particular, the ability to design the frequency band in which the trace operates allows the trace structure to be used in environments such as broadband, storage, RF applications and other high speed applications.

The foregoing description of the invention has been described for purposes of clarity and understanding. It is not intended to limit the invention to the precise form disclosed. Various modifications may be possible within the scope and equivalence of the appended claims.

I claim:

1. A system for electrically coupling a driver package to a load, said system comprising:

a pad that provides an electrical bonding location on said driver package;

a bondwire, coupled to said pad, that communicates an electrical signal from said driver package, said bondwire causing inductive effects to said electrical signal; and a trace, coupled to said bondwire, that communicates said electrical signal to a load and comprises a plurality of tuning stubs, said plurality of tuning stubs being designed to match a first impedance of said trace to a second impedance of said driver package and said bondwire such that said tuning stub design particularly compensates for said inductive effects caused by said bondwire.

2. The system of claim 1 wherein at least two tuning stubs within the plurality of tuning stubs have different widths.

3. The system of claim 2 wherein the width of the tuning stubs within the plurality of tuning stubs decreases relative to a distance of each of the tuning stubs from the bondwire.

4. The system of claim 2 wherein the width of the tuning stubs within the plurality of tuning stubs increases relative to a distance of each of the tuning stubs from the bondwire.

5. The system of claim 1 wherein said system is a broadband system.

6. The system of claim 1 wherein said system is a storage system implementing a Fibre Channel protocol.

7. The system of claim 1 wherein said tuning stubs are designed to provide a particular capacitance on said trace over a particular band of frequencies in relation to said second impedance of said driver package and said bondwire in order to compensate for said inductive effects caused by said bondwire.

8. A method for impedance matching within a wirebond package environment, said method comprising:
    coupling a pad on a semiconductor package to a bondwire;
    coupling said bondwire to a trace having a plurality of impedance tuned stubs; and
    designing said plurality of impedance tuned stubs to provide an impedance transformation from said bondwire to a load in order to compensate for inductive effects caused by said bondwire.

9. The method of claim 8 wherein the widths of the impedance tuned stubs within the plurality of tuning stubs increases in relation to a distance from a tuning stub to the bondwire.

10. The method of claim 8 wherein a second trace having a second plurality of impedance tuned stubs provides a differential signal transmission line between the semiconductor package and the load.

11. The method of claim 8 wherein said impedance transformation effectively cancels a majority of inductance caused by said bondwire.

* * * * *